(12) United States Patent
Seong et al.

(10) Patent No.: US 9,449,734 B2
(45) Date of Patent: Sep. 20, 2016

(54) CONDUCTIVE METAL INK COMPOSITION, AND METHOD FOR PREPARING A CONDUCTIVE PATTERN

(75) Inventors: Jiehyun Seong, Daejeon (KR); Kyoung Su Jeon, Seoul (KR); Soo Yeon Heo, Daejeon (KR); Jong Taik Lee, Daejeon (KR); Ji Young Hwang, Daejeon (KR); In-Seok Hwang, Daejeon (KR); Seung-Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 144 days.

(21) Appl. No.: 13/819,313

(22) PCT Filed: Aug. 26, 2011

(86) PCT No.: PCT/KR2011/006343
§ 371 (c)(1),
(2), (4) Date: Jul. 8, 2013

(87) PCT Pub. No.: WO2012/026791
PCT Pub. Date: Mar. 1, 2012

(65) Prior Publication Data
US 2013/0277096 A1 Oct. 24, 2013

(30) Foreign Application Priority Data

Aug. 27, 2010 (KR) ........................ 10-2010-0083589

(51) Int. Cl.
*H01B 1/22* (2006.01)
*B05D 5/12* (2006.01)
(Continued)

(52) U.S. Cl.
CPC *H01B 1/22* (2013.01); *B05D 5/12* (2013.01); *C09D 11/033* (2013.01); *C09D 11/037* (2013.01); *C09D 11/52* (2013.01); *H05K 1/02* (2013.01); *H05K 1/097* (2013.01); *H05K 3/1275* (2013.01); *H05K 2201/0272* (2013.01); *H05K 2203/0534* (2013.01)

(58) Field of Classification Search
CPC ............ H01B 1/00; H01B 1/22; B05D 5/12
See application file for complete search history.

(56) References Cited

U.S. PATENT DOCUMENTS

| 2005/0113489 A1 | 5/2005 | Baran et al. |
| 2008/0241414 A1 | 10/2008 | Kim et al. |

(Continued)

FOREIGN PATENT DOCUMENTS

| CN | 101523508 A | 9/2009 |
| JP | 2006-335995 | 12/2006 |

(Continued)

OTHER PUBLICATIONS

Calvert, P. "Inkjet Printing for Materials and Devices," Chem. Mater. 13, pp. 3299-3305 (2001).*

*Primary Examiner* — Mark Kopec
(74) *Attorney, Agent, or Firm* — Dentons US LLP

(57) ABSTRACT

The present invention relates to a conductive metal ink composition, comprising: a first metal powder having conductivity; a non-aqueous solvent; an attachment improving agent; and a polymer coating property improving agent, and a method for forming a conductive pattern by using the conductive metal ink composition, and the conductive metal ink composition can be appropriately applied to a roll printing process and a conductive pattern exhibiting more improved conductivity and excellent attachment ability with respect to a board can be formed.

10 Claims, 3 Drawing Sheets

(51) Int. Cl.
*C09D 11/52* (2014.01)
*H05K 1/09* (2006.01)
*H05K 1/02* (2006.01)
*C09D 11/033* (2014.01)
*C09D 11/037* (2014.01)
*H05K 3/12* (2006.01)

(56) References Cited

U.S. PATENT DOCUMENTS

| | | |
|---|---|---|
| 2009/0004445 A1 | 1/2009 | Park et al. |
| 2009/0274834 A1* | 11/2009 | Chopra et al. ................ 427/125 |
| 2010/0021704 A1 | 1/2010 | Yoon |
| 2012/0031290 A1* | 2/2012 | Lee et al. ...................... 101/395 |
| 2013/0313490 A1* | 11/2013 | Eiden et al. .................. 252/514 |

FOREIGN PATENT DOCUMENTS

| | | | |
|---|---|---|---|
| JP | 2009-515023 A | | 4/2009 |
| JP | 2010-059409 | | 3/2010 |
| KR | 10-2006-0017686 | | 2/2006 |
| KR | 20060017686 A | | 2/2006 |
| KR | 10-2008-0029826 | | 4/2008 |
| KR | 10-2008-0088712 | | 10/2008 |
| KR | 10-2010-0088483 | | 8/2010 |
| KR | 20100088483 A | | 8/2010 |
| WO | WO 2011/101788 | * | 8/2011 ............. H01L 31/05 |

\* cited by examiner

US 9,449,734 B2

CONDUCTIVE METAL INK COMPOSITION, AND METHOD FOR PREPARING A CONDUCTIVE PATTERN

TECHNICAL FIELD

This application is a National Stage Entry of International Application No. PCT/KR2011/006343, filed Aug. 26, 2011, and claims the benefit of Korean Application No. 10-2010-0083589 filed on Aug. 27, 2010 all of which are hereby incorporated by reference in their entirety for all purposes as if fully set forth herein. The present invention relates to a conductive metal ink composition and a method for forming a conductive pattern. More particularly, the present invention relates to a conductive metal ink composition that is appropriately applied to a roll printing process so that a conductive pattern exhibiting more improved conductivity and excellent attachment ability with respect to a board can be formed, and a method for forming a conductive pattern by using the same.

BACKGROUND ART

Currently, various flat panel display diodes are widely used. In order to manufacture the flat panel display diode, various conductive patterns such as electrodes, wires, or electromagnetic wave blocking filters are formed on a substrate, and the most widely used process for forming these patterns is photolithography.

However, in order to form a pattern by the photolithography, various processes such as coating, exposing, developing and etching of a photosensitive material should be performed, thereby making an entire diode manufacturing process complicated and largely reducing economic efficiency of the process.

Accordingly, currently, an interest for a method for forming a conductive pattern by an inkjet printing method or a roll printing method is growing. In particular, in the case of the roll printing method, since there is an advantage in a process, in that it is possible to form a fine conductive pattern that is difficult to be formed by the inkjet printing method, the method is receiving a more large attention.

However, in order to form the good conductive pattern by the roll printing method, the conductive ink composition for forming the conductive pattern should have a low initial viscosity and be coated well on the roller, and should be transferred well to the substrate in a desired pattern form after being coated on the roller. Further, since the conductive metal comprised in the conductive ink composition has poor attachment ability to the board and is easily agglomerated in the firing process, surface characteristics of the conductive pattern and physical properties of the final product may be reduced. Accordingly, there is required a conductive ink composition having characteristics suitable to form a good conductive pattern by the roll printing method and high attachment ability to a board.

However, until now, a conductive ink composition that can favorably form a fine conductive pattern well by the roll printing method has not been yet developed. Moreover, in the case where the previously developed conductive ink composition is applied, the conductivity and the attachment ability to the board of the conductive pattern were not sufficient, and as a result, there is required development for a conductive ink composition that can form a fine conductive pattern having more excellent characteristics.

DISCLOSURE

Technical Problem

The present invention has been made in an effort to provide a conductive metal ink composition that is appropriately applied to a roll printing process so that a conductive pattern exhibiting more improved conductivity and excellent attachment ability with respect to a board can be formed.

Further, the present invention has been made in an effort to provide a method for forming a conductive pattern by using the conductive metal ink composition.

Technical Solution

An exemplary embodiment of the present invention provides a conductive metal ink composition, comprising: a first metal powder having conductivity; a non-aqueous solvent comprising a first non-aqueous solvent having a vapor pressure of 3 torr or less at 25° C. and a second non-aqueous solvent having a vapor pressure of more than 3 torr at 25° C.; an attachment improving agent comprising one or more second metal powders or compound of second metals selected from the group consisting of nickel (Ni), bismuth (Bi), tin (Sn), titanium (Ti), palladium (Pd), chromium (Cr), cobalt (Co), germanium (Ge), zinc (Zn), molybdenum (Mo), tantalum (Ta), niobium (Nb), magnesium (Mg), tungsten (W) and vanadium (V); and a polymer coating property improving agent.

Another exemplary embodiment of the present invention provides a method for forming a conductive pattern, comprising: coating the conductive metal ink composition on a roller; forming a pattern of the ink composition corresponding to the conductive pattern on the roller by contacting a cliche where the pattern corresponding to the conductive pattern is intaglioed with the roller; transferring the ink composition pattern on the roller to a substrate; and firing the pattern transferred to the substrate.

Advantageous Effects

According to the exemplary embodiments of the present invention, a conductive metal ink composition that is appropriately applied to a roll printing process so that a conductive pattern exhibiting more improved conductivity and excellent attachment ability with respect to a board can be formed, and a method for forming a conductive pattern by using the conductive metal ink composition are provided.

DESCRIPTION OF REFERENCE NUMERALS OF THE DRAWINGS

Figure 1:
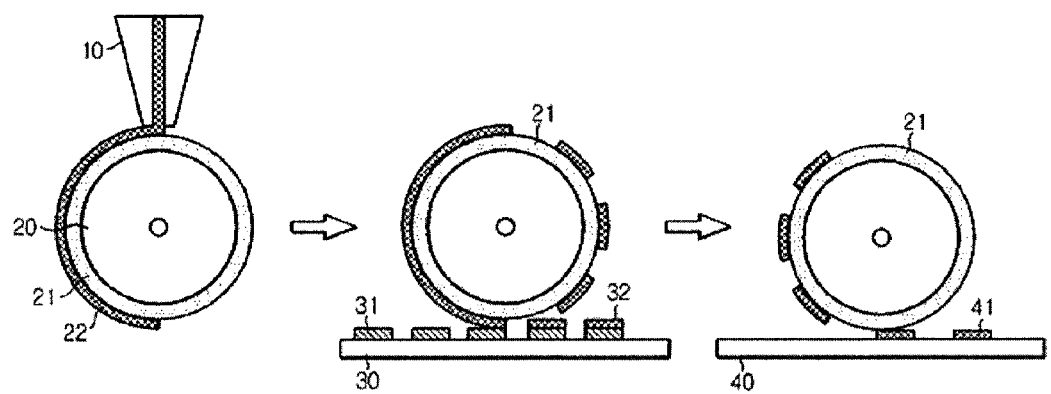
FIG. 1 is a view that schematically illustrates a process for forming a conductive pattern through a roll printing process.

10: Ink providing device
20: Roller
21: Blanket
22: Conductive ink composition

30: Cliche
31: Projection
32: Ink portion that is not necessary to form the conductive pattern
40: Substrate
41: Pattern

BEST MODE

Hereinafter, a conductive metal ink composition and a method for forming a conductive pattern according to exemplary embodiments of the present invention will be described in more detail.

According to an exemplary embodiment of the present invention, it is possible to provide a conductive metal ink composition comprising: a first metal powder having conductivity; a non-aqueous solvent comprising a first non-aqueous solvent having a vapor pressure of 3 torr or less at 25° C. and a second non-aqueous solvent having a vapor pressure of more than 3 torr at 25° C.; an attachment improving agent comprising one or more second metal powders or compound of second metals selected from the group consisting of nickel (Ni), bismuth (Bi), tin (Sn), titanium (Ti), palladium (Pd), chromium (Cr), cobalt (Co), germanium (Ge), zinc (Zn), molybdenum (Mo), tantalum (Ta), niobium (Nb), magnesium (Mg), tungsten (W) and vanadium (V); and a polymer coating property improving agent.

The present inventors found that if the conductive metal ink composition comprising the non-aqueous solvent and the attachment improving agent is used, it is possible to more favorably transfer a desired pattern to the substrate, and more favorably form a fine conductive pattern, and the conductive pattern has a high attachment ability with respect to the board through an experiment, thereby accomplishing the present invention.

Since the conductive metal powder has a property that is not well attached to a board such as glass, in a known roll printing process to which the conductive metal ink composition is applied, there are problems in that it is difficult to stably form the conductive pattern and a peeling phenomenon of the conductive pattern film occurs in a PECVD process under a severe condition.

On the other hand, in the exemplary embodiment of the present invention, the attachment improving agent comprising the second metal powder or the compound of second metal is applied, and since the attachment improving agent comprising the second metal powder or the compound of second metal may be easily attached to the board such as glass and form an alloy with the first metal powder having conductivity, an attachment property of the conductive pattern and the board may be largely improved. Accordingly, the conductive pattern formed by using the conductive metal ink composition can be maintained while being firmly adhered to the board without the peeling phenomenon of the conductive pattern film even though a PECVD process of a severe condition applied in the flat panel display manufacturing process using TFT is applied.

In more detail, the second metal powder or the compound of second metal acts as a compatibilizer between the first metal powder and the glass, such that the thin film comprising the first metal powder having poor attachment ability with the glass maintains a stable contact with the glass. In order to allow the second metal powder or the compound of second metal to smoothly perform this acting, the attachment ability of the second metal powder or the compound of second metal with the glass should be good, and the metal having the good attachment ability with the glass has a characteristic of being atomically bonded to the glass.

For example, if the second metal forms a stable silicide through atomic bonding to a silicon that is one of components of the glass, attachment stability of the second metal and glass is good as compared to the metal that does not form the stable silicide. Further, if the second metal can form a stable alloy by being bonded to the first metal, a small amount of the first metal can form an alloy with the second metal through heat treatment, and a portion of the second metal can be atomically bonded to glass. Through this process, it is possible to form a conductive metal thin film in which the attachment ability with glass is improved. Metal that can form the stable silicide comprises nickel (Ni), bismuth (Bi), tin (Sn), titanium (Ti), palladium (Pd), chromium (Cr), cobalt (Co), germanium (Ge), zinc (Zn), molybdenum (Mo), tantalum (Ta), niobium (Nb), magnesium (Mg), tungsten (W) and vanadium (V).

Further, the conductive metal ink composition comprises first and second non-aqueous solvents having different vapor pressures at normal temperature as a medium. The first and second non-aqueous solvents have different volatilities due to different vapor pressures, and in particular, the second non-aqueous solvent has the low vapor pressure at normal temperature and the resultant high volatility. Accordingly, the conductive metal ink composition comprising the first and second non-aqueous solvents has the low viscosity during the storage and until the composition is coated on the roller for roll printing, and may maintain the uniform composition such as a conductive metal powder in the medium comprising the first and second non-aqueous solvents. Therefore, the conductive metal ink composition is easily uniformly coated on the roller.

In addition, if the conductive metal ink composition is exposed to the air because of the high volatility of the second non-aqueous solvent in the medium, the second non-aqueous solvent is immediately volatilized, and the viscosity may be largely increased within approximately several minutes. Accordingly, it is easy to pattern the ink composition coated on the roller in a desired form, and the ink composition may maintain the good pattern form while the ink composition does not flow down from the roller even after the pattern is formed.

Therefore, if the roll printing process is applied by using the conductive metal ink composition, a desired pattern form may be more well transferred to the substrate, and the fine conductive pattern may be well formed.

Meanwhile, the conductive metal ink composition according to the exemplary embodiment of the present invention comprises the first metal powder having conductivity. This first metal powder may comprise a predetermined metal powder that exhibits electric conductivity, but it is preferable that one or more of silver (Ag) or copper (Cu) having the high conductivity are selected in the metals.

The first metal powder may have a nanoscale average particle diameter so that the first metal powder is uniformly dispersed in the ink composition and the conductive pattern formed from the ink composition has excellent and uniform conductivity. For example, the first metal powder may have the average particle diameter of 1 to 100 nm, preferably 5 to 70 nm, and more preferably 5 to 50 nm.

The first metal powder may be comprised in the content of 15 to 30 wt % on the basis of the total weight of the components of the ink composition, for example, the first metal powder, the first and second non-aqueous solvents and the polymer coating property improving agent. If the content of the first metal powder is excessively small, the conductivity of the conductive pattern formed from the ink composition may not be sufficient, and on the other hand, if the content is excessively large, dispersibility of the metal powder in the ink composition becomes poor, such that characteristics of the conductive pattern become poor or it may be difficult to uniformly coat the ink composition.

Further, the conductive metal ink composition comprises the first and the second non-aqueous solvents. The first non-aqueous solvent is a solvent having the vapor pressure of 3 torr or less at 25° C. and showing relatively low volatility, and may act as a dispersing medium of the ink composition until the firing.

The first non-aqueous solvent may comprise a predetermined non-aqueous solvent that is known to have the vapor pressure of 3 torr or less at 25° C., and for example, may comprise an alcohol-based solvent, a glycol-based solvent, a polyol-based solvent, a glycol ether-based solvent, a glycol ether ester-based solvent, a ketone-based solvent, a hydrocarbon-based solvent, a lactate-based solvent, an ester-based solvent, an aprotic sulfoxide-based solvent or a nitrile-based solvent having the vapor pressure of 3 torr or less at 25° C., or a mixture solvent comprising two or more kinds selected therefrom. The first non-aqueous solvent may comprise ethylene glycol, propylene glycol, glycerol, propylene glycol propylether, ethylene glycol monophenylether, ethylene glycol monoisopropylether, propylene glycol monobutylether, diethyleneglycol monobutylether, diethyleneglycol monobutylether acetate, diethyleneglycol ethylether, N-methylpyrrolidone, hexadecane, pentadecane, tetradecane, tridecane, dodecane, undecane, decane, DMSO, acetonitrile, acetone alcohol or butylcellosolve, and a mixture solvent comprising two or more kinds selected therefrom, needless to say.

Meanwhile, the second non-aqueous solvent is a solvent having the vapor pressure of more than 3 torr at 25° C. and high volatility, and as described above, maintains the low viscosity of the ink composition and excellent coating property to the roller in conjunction with the first non-aqueous solvent until the ink composition is coated on the roller, and is removed by volatilization, thus increasing the viscosity of the ink composition and allowing the forming and the maintaining of the pattern on the roller to be well performed.

The second non-aqueous solvent may comprise a predetermined non-aqueous solvent that is known to have the vapor pressure of more than 3 torr at 25° C., and for example, may comprise an alcohol-based solvent, a glycol ether-based solvent, a glycol ether ester-based solvent, a ketone-based solvent, a hydrocarbon-based solvent, a lactate-based solvent, an ester-based solvent, an aprotic sulfoxide-based solvent or a nitrile-based solvent having the vapor pressure of more than 3 torr at 25° C., or a mixture solvent comprising two or more kinds selected therefrom. The second non-aqueous solvent may comprise methanol, ethanol, propanol, isopropanol, n-butanol, t-butanol, pentanol, hexanol, nonan, octane, heptane, hexane, acetone, methylethylketone, methylisobutylketone, methylcellosolve, ethylcellosolve, ethylene glycol dimethylether, ethylene glycol diethyl ether, propylene glycol methyl ether acetate, chloroform, methylene chloride, 1,2-dichloroethane, 1,1,1-trichloroethane, 1,1,2-trichloroethane, 1,1,2-trichloroethene, cyclohexane, tetrahydrofurane, benzene, toluene or xylene, and a mixture solvent of two or more kinds selected therefrom, needless to say.

The first and second non-aqueous solvents may be comprised in the content of 5 to 70 wt % and 10 to 74 wt % on the basis of the total weight of the components of the ink composition, for example, the first metal powder, the first and second non-aqueous solvents and the polymer coating property improving agent.

In the case where the content of the first non-aqueous solvent is excessively small or the content of the second non-aqueous solvent is excessively large, after the ink composition is coated on the roller, a drying speed becomes fast, such that it is difficult to perform transferring to the substrate. On the other hand, if the content of the first non-aqueous solvent is excessively large or the content of the second non-aqueous solvent is excessively small, the drying speed becomes slow, such that a process time is lengthened and it is difficult to uniformly coat the ink composition.

Meanwhile, in order to stably form the conductive pattern by improving the attachment ability with the board such as glass, the conductive metal ink composition according to the exemplary embodiment of the present invention may use an attachment improving agent comprising second metal powder or the compound of second metal selected from the group consisting of nickel (Ni), bismuth (Bi), tin (Sn), titanium (Ti), palladium (Pd), chromium (Cr), cobalt (Co), germanium (Ge), zinc (Zn), molybdenum (Mo), tantalum (Ta), niobium (Nb), magnesium (Mg), tungsten (W), vanadium (V) or mixtures thereof. The second metal component comprised in the second metal powder or the compound of second metal can form an alloy with the first metal powder and has a largely high attachment ability to the board such as glass, such that the attachment improving agent comprising the same may allow the conductive pattern formed by using the conductive metal ink composition to be stably attached to the board such as glass.

More preferably, the attachment improving agent may comprise the second metal powder, the compound of the second metal, or mixtures thereof. The attachment improving agent applied in a powder form of metal may have the high attachment ability to the board such as glass, may easily form an alloy with the first metal powder, and may be stably dispersed in the ink composition.

Further, the compound of the second metal may act as the attachment improving agent like the second metal powder, and may comprise oxides of the above second metals, carboxylates of the second metals, acetylacetonates of the second metals or mixtures thereof.

In order to allow the attachment improving agent to be uniformly dispersed in the ink composition, easily form an alloy with the first metal powder, and implement the high attachment ability with respect to the board, the powder of the second metal may have a nanoscaleaverage particle diameter, and the compound of the second metal may be added after being dissolved in an appropriate solvent.

The attachment improving agent may be comprised in the content of 0.1 to 10 parts by weight on the basis of 100 parts by weight of the first metal powder having the conductivity comprised in the ink composition. If the content of the attachment improving agent is too small, the attachment ability of the conductive pattern with respect to the board cannot be sufficiently improved, and if the content of the attachment improving agent is too large, since the viscosity of the ink composition is increased, inconvenience may occur in progress of the process.

In order to stably disperse the second metal powder in the ink composition, a known predetermined dispersing agent that may be used in the conductive metal ink composition may be further added. The dispersing agent may comprise a polymer having a known structure, such as polyethylene glycol, polyethylene glycol nonylphenylether, polyethylene glycol sorbitan trioliate, polyethylene glycol sorbitan monooliate, polyethylene glycol sorbitan monolaurate, polyethylene glycol sorbitan monopalmitate, polyethyleneimine, polyacrylic acid, polyvinylpyrrolidone, polyacrylamide, and polyacrylic acid sodium, and derivatives thereof, or Disperbyk® 111, Disperbyk® 110, Disperbyk® 106, Disperbyk® 140, Disperbyk® 108, Disperbyk® 174, Disperbyk® 180, Disperbyk® 183, Disperbyk® 184, and Disperbyk® 190 manufactured by BYK Co., Ltd. or Tego® 652 manufactured by Tego Co., Ltd., but is not limited thereto.

Meanwhile, the conductive metal ink composition may comprise a polymer coating property improving agent. The coating property improving agent acts as a binder in the ink composition, and is a component that provides an adhesion property to the ink composition so that the ink composition is well coated or transferred on the roller and the substrate on which the conductive pattern is formed.

The coating property improving agent may comprise an epoxy-based polymer, a phenol-based polymer or an alcohol-based polymer, and a mixture of two or more kinds selected there from. The epoxy-based polymer of the coating property improving agent comprises a bisphenol A epoxy polymer, a bisphenol F epoxy polymer, a novolac epoxy polymer, an inflammable epoxy polymer such as an epoxy bromide polymer, an epoxy polymer having an aliphatic cycle, a rubber denatured epoxy polymer, an aliphatic polyglycidyl epoxy polymer or a glycidyl amine epoxy polymer. Further, the phenol-based polymer may comprise a novolac phenol polymer or a resol phenol polymer, and as the alcohol-based polymer, there may be a cellulose-based polymer, polyvinyl alcohol, an ethylenevinylalcohol polymer or a benzyl alcohol polymer. Besides, ethylenevinylacetate, a rosin-based resin, a styrene-butadiene-styrene-based polymer or a polyester-based polymer may be used.

A material that is widely known or commercialized in the art as the material that belongs to the detailed examples may be used as the coating property improving agent, and in addition to the materials, various polymer materials that are known to be used in the conductive ink composition may be used as the coating property improving agent.

Since the ink composition comprises the coating property improving agent, the ink composition may show an excellent coating property to the roller and an excellent transferring property to the substrate, such that the composition can be appropriately applied to the roll printing process, and a finer conductive pattern may be well formed on the substrate.

The polymer coating property improving agent may be comprised in the content of 0.1 to 5 wt % on the basis of the total weight of the components of the ink composition, for example, the first metal powder, the first and second non-aqueous solvents and the polymer coating property improving agent. If the content of the coating property improving agent is excessively small, the coating property or the transferring property of the ink composition may not be sufficient, and on the other hand, if the content is excessively large, the conductivity of the conductive pattern formed from the ink composition may not be sufficient.

Further, the conductive metal ink composition according to the exemplary embodiment of the present invention may further comprise an additive such as a surfactant. The kind of the surfactant is not particularly limited, but materials known in the art may be used.

Meanwhile, the conductive metal ink composition according to the exemplary embodiment of the present invention may further comprise an organic silver complex compound forming a complex by bonding the organic ligand comprising the amine group and the hydroxy group to aliphatic silver (Ag) carboxylate.

The organic silver complex compound may be exemplified by the compound disclosed in Korean Patent Application Laid-Open No. 2008-0029826, and may have high solubility to the solvent, maintain a liquid phase at normal temperature, and show excellent stability in the ink composition without a separate dispersing agent. That is, the organic silver complex compound may act as a sort of medium and comprises silver (Ag). If the organic silver complex compound is comprised in the conductive metal ink composition, while the content of the non-aqueous solvent comprised in the ink composition is reduced, more contents of conductive metal components, for example, silver (Ag) or other conductive powders may be comprised. Therefore, the conductive metal ink composition comprising the organic silver complex compound in conjunction with the first metal powder having the conductivity may show more improved conductivity.

The organic silver complex compound may be formed by bonding the organic ligand selected from the group consisting of primary to quaternary amines substituted by the alcohol group to aliphatic silver carboxylate. Further, the aliphatic silver carboxylate may be selected from the group consisting of primary or secondary fatty acid silver (Ag) salts having 2 to 20 carbon atoms. The organic ligand and aliphatic silver (Ag) carboxylate forming the organic silver complex compound may form a complex by being bonded in an equivalent ratio of 2:1.

Since the organic silver complex compound has a complex form, the compound shows the low crystallinity and resultant excellent solubility to the solvent, and may have a liquid phase at normal temperature. Since the organic silver complex compound may act as a liquid phase medium, while the content of the medium comprised in the ink composition, that is, the non-aqueous solvent is reduced, more contents of conductive metal components, for example, the content of the silver (Ag) component comprised in the first metal powder or the complex compound may be increased by further comprising the organic silver complex compound in the ink composition. Therefore, it is found that the conductive pattern having more improved conductivity may be formed by the roll printing process by applying the ink composition.

Further, since the organic silver complex compound comprises the organic ligand and aliphatic silver carboxylate in an equivalent ratio of 2:1 and has 2 hydroxy groups per one molecule, for example, the high viscosity of 50 to 2,000 cPs may be shown at normal temperature (about 25° C.). Accordingly, the organic silver complex compound may act preferably as a sort of medium of the ink composition and allow the ink composition to maintain excellent dispersion stability in the low content of the non-aqueous solvent.

Therefore, if the ink composition further comprises the organic silver complex compound, it is possible to well form the conductive pattern having higher density of the conductive metal component and resultant excellent conductivity.

The organic silver complex compound, as disclosed in Korean Patent Application Laid-Open No. 2008-0029826, may be manufactured by a method for reacting the organic ligand and aliphatic silver carboxylate under a solvent, and in this case, as the solvent, methanol, terpineol, or butylcarbitolacetate may be used.

The organic silver complex compound may be comprised in the content of 0.1 to 5 parts by weight on the basis of 100 parts by weight of the first metal powder having the conductivity comprised in the ink composition. If the content of the organic silver complex compound is excessively small, the conductivity of the conductive pattern formed from the ink composition may not be sufficient, and if the content of the organic silver complex compound is excessively large, the viscosity of the ink composition is increased, such that inconvenience may occur when the process is performed.

The conductive metal ink composition according to the exemplary embodiment of the present invention may have an initial viscosity of 10 cPs or less, and preferably 5 cPs or less. In this case, the initial viscosity means a total viscosity from initial manufacturing of the conductive metal ink composition to coating of the composition on the roller for the roll printing process. The conductive metal ink composition may have the low initial viscosity by comprising the first and the second non-aqueous solvents, such that the composition may show excellent coating property to the roller. Further, after the coating to the roller, because of the vaporization of the second non-aqueous solvent having the high volatility, the viscosity on the roller may be increased, such that the pattern may be well formed and maintained on the roller and the pattern may be well transferred on the substrate.

Therefore, by applying the roll printing process by using the conductive metal ink composition, it is possible to well form finer conductive patterns on the substrate and the conductive pattern may show the more excellent conductivity.

Accordingly, the conductive metal ink composition may be printed on the substrate, for example, a glass substrate, by the roll printing process, to be preferably applied in order to form the conductive pattern, and in particular, the composition may be very preferably applied in order to form an electrode pattern of a flat panel display diode.

According to another exemplary embodiment of the present invention, there is provided a method for forming the conductive pattern using the conductive metal ink composition described above. The method for forming a conductive pattern may comprise coating the conductive metal ink composition on a roller; forming a pattern of the ink composition corresponding to the conductive pattern on the roller by contacting a cliche where the pattern corresponding to the conductive pattern is intaglioed with the roller; transferring the ink composition pattern on the roller to a substrate; and firing the pattern transferred to the substrate.

In the method for forming the conductive pattern, the cliche means a kind of uneven plate that is used in order to pattern the ink composition coated on the roller in a desired conductive pattern form. To this end, the pattern corresponding to the conductive pattern may be intaglioed on the cliche.

Meanwhile, with reference to the accompanying drawings, the method for forming the conductive pattern according to another exemplary embodiment of the present invention will be described for each step. FIG. 1 is a view that schematically illustrates a process for forming a conductive pattern through a roll printing process.

First, the conductive metal ink composition described above is formed. To this end, the components are mixed, and agitated or stirred, thereby forming the uniform ink composition. Further, in order to remove an impurity and uniformly form the conductive pattern, a step for filtering the ink composition may be further performed.

Subsequently, the conductive ink composition 22 is coated on a roller 20. In this case, the outer surface of the roller 20 may be covered with a blanket 21, and the blanket 21 may be formed of polydimethylsiloxane (PDMS). Since the PDMS has excellent viscoelasticity, deformation property or transferring property as compared to other polymer materials, the PDMS can be appropriately used as the blanket 21. The conductive ink composition 22 may be coated on the blanket 21 by being discharged from a discharging part 10 of a supplying device, and from this point, the second non-aqueous solvent starts to be vaporized, and the viscosity of the ink composition 22 starts to be rapidly increased.

After the ink composition 22 is coated on the blanket 21, the pattern of the ink composition corresponding to the conductive pattern is formed on the roller by contacting the cliche where the pattern corresponding to the desired conductive pattern is intaglioed with the roller.

That is, the cliche 30 selectively removes an ink portion 32 where it is not necessary to form the conductive pattern by contacting the cliche with the blanket 21 on which the ink composition 22 is coated, such that the pattern of the ink composition corresponding to the desired conductive pattern may be formed on the roller. To this end, the cliche 30 is formed in such a manner that the pattern corresponding to the desired conductive pattern is intaglioed on the surface contacted with the blanket 21, such that the ink portion 32 where it is not necessary to form the conductive pattern may be transferred on the protrusion 31 and removed by contacting only the protrusion 31 of the cliche 30 with the ink composition 22 on the blanket 21.

After the pattern of the ink composition is formed on the roller, the pattern of the ink composition is transferred to the substrate. To this end, the blanket 21 of the roller where the pattern of the ink composition is formed may be contacted with the substrate 40, such that a predetermined pattern 41 may be formed on the substrate 40 by transferring the pattern of the ink composition to the substrate 40.

After the pattern is transferred, the conductive pattern may be formed on the substrate by performing a firing process. The firing process may be performed under the appropriate condition according to a kind of the conductive pattern to be formed, and for example, in the case where the conductive pattern becomes the electrode pattern of the flat panel display diode, the firing process may be performed at 400 to 600° C. for 5 to 50 min, and for example, at 450° C. for 10 to 40 min.

As described above, through the method for forming the conductive pattern by using the roll printing process, it is possible to form the conductive pattern on the substrate by a very simple and rapid process as compared to a photolithography process applied in the related art. Further, since in the roll printing process, the conductive metal ink composition according to the exemplary embodiment of the present invention is used, the fine conductive pattern having excellent conductivity, for example, the electrode pattern of the flat panel display diode may be well formed.

MODE FOR INVENTION

The invention will be described in more detail in the following Examples. However, the following Examples are set forth to illustrate but are not to be construed to limit the present invention.

EXAMPLE

Example 1

Conductive Metal Ink Composition and Formation of Conductive Pattern 8.57 g of the silver nanoparticles having the average particle diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure of 0.76 torr at 25° C.), 0.7 g of Tackirol 160, 0.2 g of BYK® 333 that was the silicon-based surfactant, 0.0857 g of the nickel nanoparticles having the average particle diameter of 100 nm, and 0.004 g of Disperbyk® 180 were mixed with each other, agitated for 24 hours, and filtered by the filter of 1 μm, thus manufacturing the ink composition. The initial viscosity of ink was measured by using the Brookfield viscometer, and as a result thereof, the viscosity was 3.2 cps.

After the ink composition was coated on the PDMS blanket of the roller, the pattern of the ink composition was formed on the roller by contacting a cliche where the pattern corresponding to the desired conductive pattern was intaglioed with the blanket. Thereafter, the pattern was formed on the glass substrate by contacting the roller with the glass substrate. The conductive pattern was formed by firing the above pattern in the heat firing furnace at 450° C. for 10 min.

Example 2

8.57 g of the silver nanoparticles having the average particle diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure of 0.76 torr at 25° C.), 0.7 g of Tackirol 160, 0.2 g of BYK® 333, 0.0857 g of the tin nanoparticles having the average particle diameter of 100 nm, and 0.01 g of tin(II) (2-ethylhexanoate) were mixed with each other, agitated for 24 hours, and filtered by the filter of 1 μm, thus manufacturing the ink composition. Thereafter, the conductive pattern was formed by using the same method as Example 1, and the physical properties were evaluated by using the same method as Example 1.

Example 3

8.57 g of the silver nanoparticles having the average particle diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure of 0.76 torr at 25° C.), 0.7 g of Tackirol 160, 0.8 g of BYK® 337, 0.0857 g of the magnesium oxide nanoparticles having the average particle diameter of 20 nm, and 0.005 g of Disperbyk® 180 were mixed with each other, agitated for 24 hours, and filtered by the filter of 1 thus manufacturing the ink composition. Thereafter, the conductive pattern was formed by using the same method as Example 1, and the physical properties were evaluated by using the same method as Example 1.

Example 4

8.57 g of the silver nanoparticles having the average particle diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure of 0.76 torr at 25° C.), 0.03 g of urethane diol-based polymer, 0.2 g of BYK® 333, and 0.08 g of bismuth(III) neodecanoate were mixed with each other, agitated for 24 hours, and filtered by the filter of 1 μm, thus manufacturing the ink composition. Thereafter, the conductive pattern was formed by using the same method as Example 1, and the physical properties were evaluated by using the same method as Example 1.

Example 5

8.57 g of the silver nanoparticles having the average particle diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure of 0.76 torr at 25° C.), 0.24 g of acetone alcohol (vapor pressure of 2.95 torr at 25° C.), 0.7 g of Tackirol 160, 0.2 g of Tego® Glide 482 and 0.08 g of palladium(II) acetate were mixed with each other, agitated for 24 hours, and filtered by the filter of 1 μm, thus manufacturing the ink composition. Thereafter, the conductive pattern was formed by using the same method as Example 1, and the physical properties were evaluated by using the same method as Example 1.

Example 6

8.57 g of the silver nanoparticles having the average particle diameter of 50 nm, 2.3 g of methyl cellosolve (vapor pressure of 6.2 torr at 25° C.), 7 g of ethanol (vapor pressure of 59.3 torr at 25° C.), 0.08 g of styrene-benzylmethacrylate copolymer, 10 g of butyl cellosolve (vapor pressure of 0.76 torr at 25° C.), 0.24 g of acetone alcohol (vapor pressure of 2.95 torr at 25° C.), 0.2 g of BYK® 333 and 0.08 g of nickel(II) (2-ethylhexanoate) were mixed with each other, agitated for 24 hours, and filtered by the filter of 1 μm, thus manufacturing the ink composition. Thereafter, the conductive pattern was formed by using the same method as Example 1, and the physical properties were evaluated by using the same method as Example 1.

Example 7

8.57 g of the silver nanoparticles having the average particle diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure of 0.76 torr at 25° C.), 0.24 g of acetone alcohol (vapor pressure of 2.95 torr at 25° C.), 0.7 g of Tackirol 160, 0.2 g of BYK® 333 and 0.08 g of cobalt(III) acetate were mixed with each other, agitated for 24 hours, and filtered by the filter of 1 μm, thus manufacturing the ink composition. Thereafter, the conductive pattern was formed by using the same method as Example 1, and the physical properties were evaluated by using the same method as Example 1.

Example 8

8.57 g of the silver nanoparticles having the average particle diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure of 0.76 torr at 25° C.), 0.2 g of BYK® 373, 0.86 g of the complex compound in which silver hexanoate and diethanol amine were bonded in an equivalent ratio of 2:1, and 0.02 g of palladium(II) acetate were mixed with each other, agitated for 24 hours, and filtered by the filter of 1 μm, thus manufacturing the ink composition. Thereafter, the conductive pattern was formed by using the same method as Example 1, and the physical properties were evaluated by using the same method as Example 1.

Comparative Example 1

The ink composition was manufactured and the conductive pattern was formed by using the same method as Example 1, except that the nickel nanoparticles having the average particle diameter of 100 nm were not added.

Experimental Example 1

Attachment Property Test

The adhesion properties of the conductive patterns formed in Examples 1 to 8 and Comparative Example 1 were evaluated on the basis of the ASTM D3359 method (cross cutting tape test). In detail, 11 lines were drawn in horizontal and vertical directions at an interval of 1 mm respectively on the conductive patterns of Examples 1 to 8 and Comparative Example 1, and the ratio of areas removed when the Nichiban tape was detached after being attached was evaluated.

Experimental Example 2

PECVD Deposition Test

After SiNx was deposited in a thickness of 500 nm under the conditions of 350° C. and the vacuum on the glass substrate on which the conductive pattern was formed in Examples 1 to 8 and Comparative Example 1, the occurrence of the peeling phenomenon of the conductive pattern film was evaluated by SEM and the naked eye.

Since the conductive pattern of Example 1 was stably attached to the glass substrate, it was observed that the peeling phenomenon does not occur. On the other hand, since the conductive pattern of Comparative Example 1 was unstably attached to the glass substrate, it was confirmed that the peeling phenomenon occurred.

Figure 2:
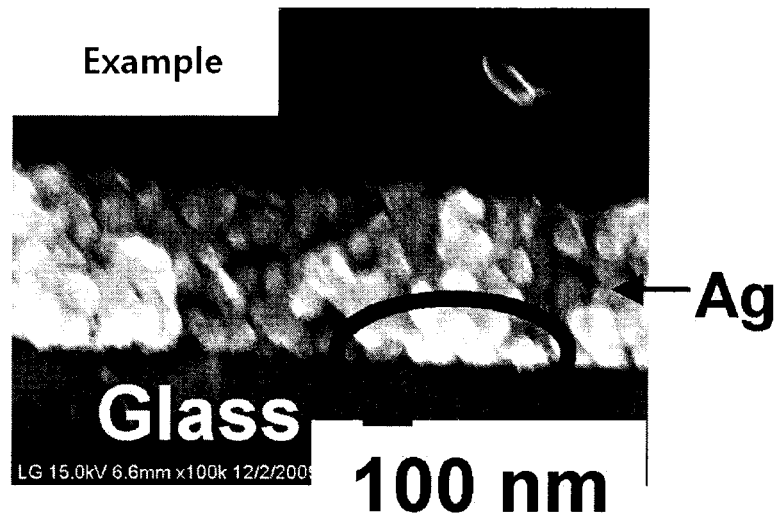
FIG. 2 is a view that illustrates an attachment state of a conductive pattern on a substrate according to Example 1 of the present invention.
Figure 2:
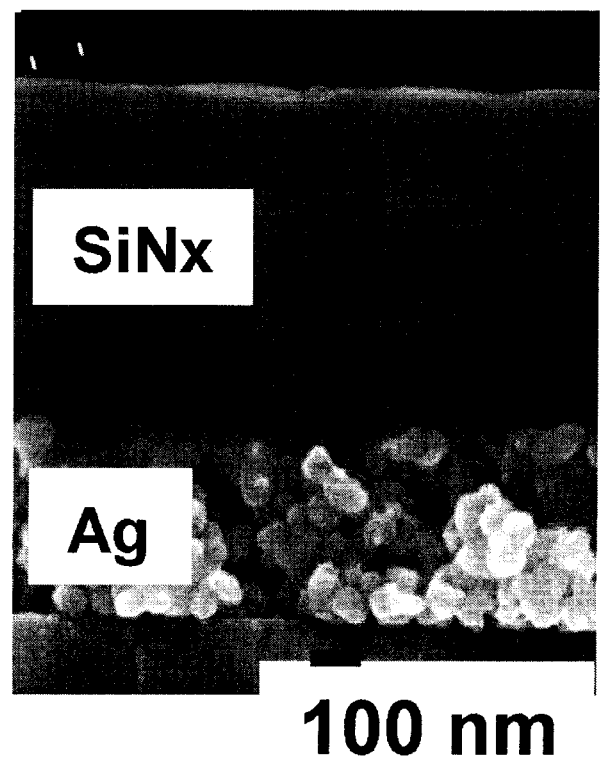
Figure 3:
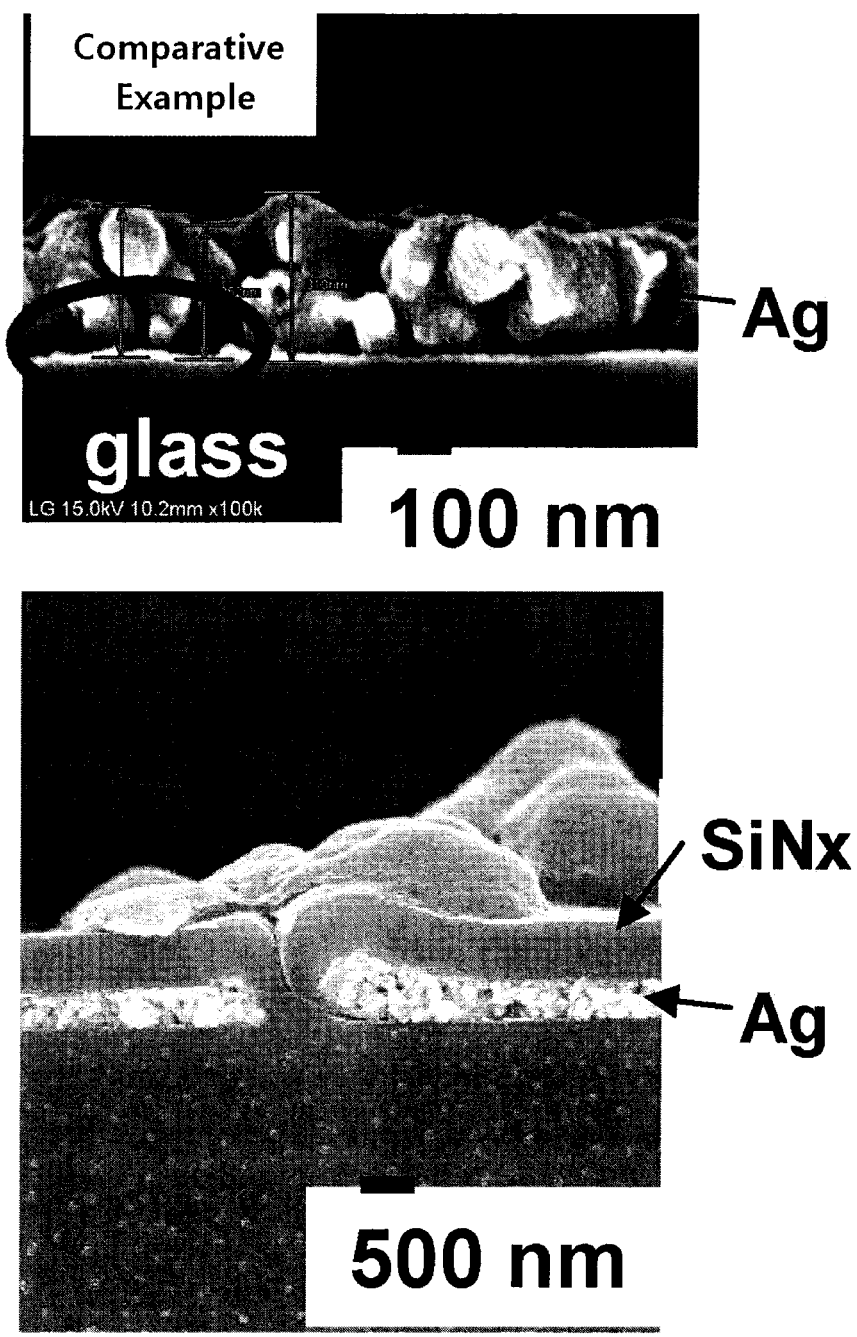
FIG. 3 is a view that illustrates an attachment state of a conductive pattern on a substrate according to Comparative Example 1 of the present invention.

The attachment states of the conductive patterns on the substrates according to Example 1 and Comparative Example 1 were shown in the following FIG. 1 and FIG. 2.

Experimental Example 3

Measurement of Specific Resistance of the Conductive Pattern

The surface resistances of the conductive patterns of Examples 1 to 8 and Comparative Example 1 were measured by the 4-point probe, and the thicknesses thereof were measured by using the Alpha step surface profiler, such that the specific resistances of the conductive patterns of Examples 1 to 8 and Comparative Example 1 were obtained.

Experimental Example 4

Measurement of Hardness

The degree of ink stained in the dustless cloth was measured by rubbing the conductive patterns of Examples 1 to 8 and Comparative Example 1 by the soft dustless cloth several times. The results of Experimental Examples 1 to 4 are described in the following Table 1.

TABLE 1

|  | Tape test result | Specific resistance ($\mu\Omega \cdot$ cm) | Dustless cloth test result |
| --- | --- | --- | --- |
| Example 1 | A | 3.03 | A |
| Example 2 | A | 90.67 | B |
| Example 3 | B | 10.30 | B |
| Example 4 | A | 7.20 | A |

TABLE 1-continued

|  | Tape test result | Specific resistance ($\mu\Omega \cdot$ cm) | Dustless cloth test result |
| --- | --- | --- | --- |
| Example 5 | A | 5.10 | A |
| Example 6 | A | 9.50 | B |
| Example 7 | B | 11.21 | B |
| Example 8 | A | 3.90 | A |
| Comparative Example 1 | D | 4.13 | D |

* In the tape test result, the case where the ratio of the removed area was 0% and there was no change was represented by 'A', the case where the ratio was 0% to 5% was represented by 'B', the case where the ratio was 5% to 20% was represented by 'C', and the case where the ratio was 20% more than was represented by 'D'.
* In the dustless cloth test result, when the substrate was rubbed by the dustless cloth several times, the case where it was not confirmed by the naked eye that ink was stained in the dustless cloth and the removal of ink from the glass substrate was not observed was represented by 'A', the case where since ink was stained in the dustless cloth in a very small amount, it was difficult to confirm ink stained in the dustless cloth by the naked eye, but the rubbing mark of the glass substrate was discriminated by the naked eye was represented by 'B', and the case where ink marks were confirmed in the dustless cloth and the glass substrate was represented by 'D'.

As shown in the above result, the conductive metal ink composition according to the exemplary embodiment of the present invention is appropriately applied to a roll printing process, such that it is possible to form a conductive pattern exhibiting more improved conductivity and excellent attachment ability with respect to a board.

The invention claimed is:

1. A conductive metal ink composition, comprising:
a first metal powder having conductivity;
a non-aqueous solvent comprising a first non-aqueous solvent having a vapor pressure of 3 torr or less at 25° C. and a second non-aqueous solvent having a vapor pressure of more than 3 torr at 25° C.;
an attachment improving agent comprising one or more second metal powders or compounds of second metal selected from the group consisting of nickel (Ni), bismuth (Bi), tin (Sn), titanium (Ti), palladium (Pd), chromium (Cr), cobalt (Co), germanium (Ge), zinc (Zn), molybdenum (Mo), tantalum (Ta), niobium (Nb), magnesium (Mg), tungsten (W) and vanadium (V); and
a polymer coating property improving agent,
wherein the first non-aqueous solvent comprises one or more selected from the group consisting of acetone alcohol and butylcellosolve,
wherein the second non-aqueous solvent comprises one or more selected from the group consisting of methanol, ethanol, propanol, isopropanol, methylcellosolve, and ethylcellosolve,
wherein a content of the attachment improving agent is 0.1 to 10 parts by weight on the basis of 100 parts by weight of the first metal powder,
wherein the first metal powder comprises silver (Ag),
wherein the content of the first non-aqueous solvent is 5 to 70 wt % on the basis of the total weight of the components of the conductive metal ink composition,
wherein the content of the second non-aqueous solvent is 10 to 74 wt % on the basis of the total weight of the components of the conductive metal ink composition, and
wherein the conductive metal ink composition is a conductive metal ink composition for a roll printing process.

2. The conductive metal ink composition according to claim 1, wherein an average particle diameter of the first metal powder is 1 to 100 nm.

3. The conductive metal ink composition according to claim 1, wherein the attachment improving agent comprises one or more selected from the group consisting of the second metal powder, oxide of the second metal, carboxylate of the second metal and acetylacetonate of the second metal.

4. The conductive metal ink composition according to claim 1, wherein the polymer coating property improving agent comprises one or more selected from the group consisting of an epoxy-based polymer, a phenol-based polymer and an alcohol-based polymer.

5. The conductive metal ink composition according to claim 1, further comprising: an organic silver complex compound.

6. The conductive metal ink composition according to claim 5, wherein the organic silver complex compound is formed by bonding an organic ligand selected from the group consisting of primary to quaternary amines that are substituted by an alcohol group to aliphatic silver carboxylate.

7. The conductive metal ink composition according to claim 5, wherein the content of the organic silver complex compound is 0.1 to 5 parts by weight on the basis of 100 parts by weight of the first metal powder.

8. The conductive metal ink composition according to claim 1, wherein a viscosity of the conductive metal ink composition is 10 cPs or less.

9. A method for manufacturing a conductive pattern, comprising:
    coating the conductive metal ink composition according to claim 1 on a roller;
    forming a pattern of the ink composition on the roller by contacting a cliche where the pattern corresponding to the conductive pattern is intaglioed with the roller;
    transferring the ink composition pattern on the roller to a substrate; and
    firing the pattern transferred to the substrate,
    wherein the firing is performed at 400 to 600° C. for 5 to 50 min.

10. A conductive pattern that is manufactured according to the method for manufacturing a conductive pattern of claim 9 and has a specific resistance of 4 $\mu\Omega\cdot$cm or less.

* * * * *